(12) United States Patent
Fernandez et al.

(10) Patent No.: US 8,022,692 B2
(45) Date of Patent: Sep. 20, 2011

(54) DIRECTION DETECTION SENSOR

(75) Inventors: Devon Fernandez, Londonderry, NH (US); William P. Taylor, Amherst, NH (US); Michael Morris, Deerfield, NH (US); P. Karl Scheller, Bow, NH (US); Eric Shoemaker, Pembroke, NH (US)

(73) Assignee: Allegro Microsystems, Inc., Worcester, MA (US)

( * ) Notice: Subject to any disclaimer, the term of this patent is extended or adjusted under 35 U.S.C. 154(b) by 384 days.

(21) Appl. No.: 12/355,882

(22) Filed: Jan. 19, 2009

(65) Prior Publication Data
US 2010/0181993 A1    Jul. 22, 2010

(51) Int. Cl.
*G01B 7/14* (2006.01)
(52) U.S. Cl. ............ 324/207.2; 324/207.21; 324/207.26
(58) Field of Classification Search .................. None
See application file for complete search history.

(56) References Cited

U.S. PATENT DOCUMENTS

| | | |
|---|---|---|
| 3,304,434 A | 2/1967 | Koster |
| 4,225,939 A | 9/1980 | Yashiro |
| 4,283,679 A | 8/1981 | Ito et al. |
| 4,513,403 A | 4/1985 | Troy |
| 4,642,555 A | 2/1987 | Swartz et al. |
| 4,649,796 A | 3/1987 | Schmidt |
| 4,893,027 A | 1/1990 | Krammerer et al. |
| 5,332,956 A | 7/1994 | Oh |
| 5,420,516 A | 5/1995 | Cabot |
| 5,442,283 A | 8/1995 | Vig et al. |
| 5,486,759 A | 1/1996 | Seiler et al. |
| 5,523,679 A | 6/1996 | Kalb |
| 5,696,790 A | 12/1997 | Graham et al. |
| 5,917,320 A | 6/1999 | Scheller et al. |
| 6,091,239 A | 7/2000 | Vig et al. |
| 6,242,904 B1 | 6/2001 | Shirai et al. |
| 6,297,627 B1 | 10/2001 | Towne et al. |
| 6,653,968 B1 | 11/2003 | Schneider |

(Continued)

FOREIGN PATENT DOCUMENTS

DE        2518054 A1       11/1976

(Continued)

OTHER PUBLICATIONS

Notification of and International Search Report and Written Opinion of the International Searching Authority for PCT/US2009/068910, dated Feb. 9, 2011, 17 pages.

(Continued)

*Primary Examiner* — Huy Q Phan
*Assistant Examiner* — Son Le
(74) *Attorney, Agent, or Firm* — Daly, Crowley, Mofford & Durkee, LLP

(57) ABSTRACT

A sensor responsive to movement of a detection target includes a magnetic field transducer operative to provide a magnetic field signal proportional to a magnetic field associated with the detection target, a peak detector for tracking positive and negative peaks of the magnetic field signal to generate a tracking signal, and a comparator having a first input responsive to the magnetic field signal, a second input responsive to an input signal related to the tracking signal, and an output at which is provided an output signal comprising first pulses having a first pulse width when the detection target moves in a first direction and second pulses having a second pulse width when the detection target moves in a second direction.

15 Claims, 11 Drawing Sheets

U.S. PATENT DOCUMENTS

| | | | |
|---|---|---|---|
| 6,693,419 | B2 | 2/2004 | Stauth et al. |
| 6,727,689 | B1 | 4/2004 | Furlong et al. |
| 6,815,944 | B2 | 11/2004 | Vig et al. |
| 6,919,720 | B2 * | 7/2005 | Vig et al. ............ 324/260 |
| 7,026,808 | B2 * | 4/2006 | Vig et al. ............ 324/179 |
| 7,199,579 | B2 | 4/2007 | Scheller et al. |
| 7,253,614 | B2 | 8/2007 | Forrest et al. |
| 7,362,094 | B2 | 4/2008 | Voisine et al. |
| 7,365,530 | B2 | 4/2008 | Bailey et al. |
| 2001/0002791 | A1 | 6/2001 | Tsuge et al. |
| 2004/0062362 | A1 | 4/2004 | Matsuya |
| 2006/0125473 | A1 * | 6/2006 | Frachon et al. ........ 324/207.26 |
| 2006/0232268 | A1 * | 10/2006 | Arns et al. ............ 324/207.13 |
| 2009/0058404 | A1 | 3/2009 | Kurumado |

FOREIGN PATENT DOCUMENTS

| | | |
|---|---|---|
| DE | 196 50 935 A1 | 6/1998 |
| DE | 19814758 A1 | 10/1999 |
| DE | 199 61 504 A1 | 6/2001 |
| DE | 102007020158 A1 | 12/2007 |
| EP | 1734343 A2 | 12/2006 |
| EP | 1734343 A3 | 12/2006 |
| FR | 2441173 A1 | 6/1980 |
| FR | 2 904 108 A1 | 1/2008 |
| JP | 56160613 A | 12/1981 |
| JP | 63-300911 | 8/1988 |
| JP | H2-116753 | 5/1990 |
| JP | 4093381 | 6/2008 |

OTHER PUBLICATIONS

Invitation to Pay Additional Fees and, Where Applicable, Protest Fee, PCT/US2009/068910, date of mailing Nov. 4, 2010, 3 pages.
Lequesne, Bruno and Schroeder, Thaddeus; "High-Accuracy Magnetic Position Encoder Concept", IEEE Transactions On Industry Applications, vol. 35, No. 3, May/Jun. 1999, p. 568-576.
Hall-Effect Direction-Detection Sensor, 3422 Data Sheet, Allegro MicroSystems, Inc., Apr. 28, 2008; 11 pages.
Infineon Technologies, "Differential Two-Wire Hall Effect Sensor IC", TLE4942 Preliminary Data Sheet, Jun. 2000, p. 1-13.
Robert Bosch GMBH Stuttgart, "Active Sensor for ABS/ASR/VDC-Systems with 2-Wire-Current Interface", Specification TLE4941/TLE4942, Version 5, Jul. 25, 2000, 44 pages.
International Search Report for PCT/US03/02489 (PCT/ISA/210); dated Nov. 19, 2003. 6 pages.
Partial International Search for PCT/US 03/02489 issued for the related PCT application; form PCT/ISA/206; 2 pgs, dated Oct. 2, 2003.
Claims filed in Amendment dated Sep. 8, 2008 for Japanese Patent Application No. 2003-568426, filed Jul. 16, 2004, 9 pages.
Letter dated Jun. 4, 2008 Office Action for Japanese Patent Application No. 2003-568426, filed Jul. 16, 2004, 54 pages.
Letter enclosing Grounds of Appeal dated Dec. 1, 2006, for EP 03710766.1, filed Jul. 22, 2004, 20 pages.
Letter enclosing minutes of oral proceedings, dated Jul. 24, 2006, for EP 03710766.1, filed Jul. 22, 2004, 9 pages.
Decision to refuse a European Patent Application, dated Jul. 24, 2006, for EP 03710766.1, filed Jul. 22, 2004, 19 pages.
Letter enclosing two sets of amendments, dated Apr. 21, 2006, for EP 03710766.1, filed Jul. 22, 2004, 18 pages.
Summons to attend oral proceedings pursuant to Rule 71(1) EPC, dated Feb. 6, 2006, for EP 03710766.1, filed Jul. 22, 2004, 9 pages.
Letter dated Jun. 20, 2005 in response to Official communication of Mar. 2, 2005 with replacement claims and replacement pages, for EP 03710766.1, filed Jul. 22, 2004, 20 pages.
Communication pursuant to Article 96(2) EPC dated Feb. 3, 2005, for EP 03710766.1, filed Jul. 22, 2004, 20 pages.
U.S. Appl. No. 10/282,528, filed Oct. 29, 2002, file through Feb. 2, 2009, 318 pages.
U.S. Appl. No. 10/948,808, filed Sep. 23, 2004, file through Feb. 2, 2009, 177 pages.

* cited by examiner

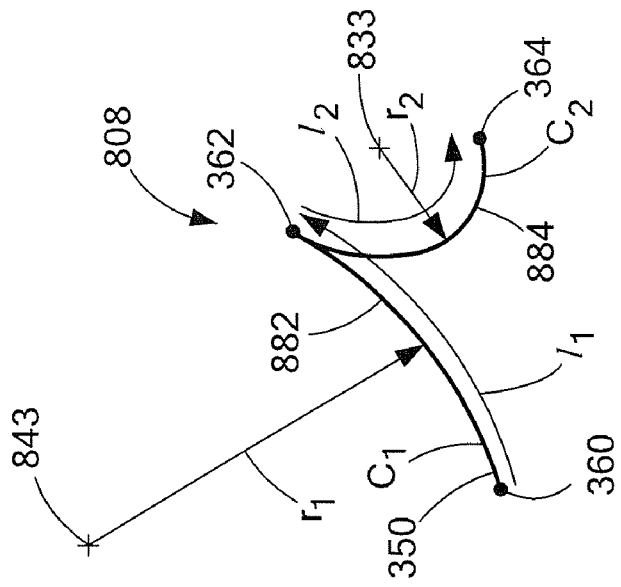
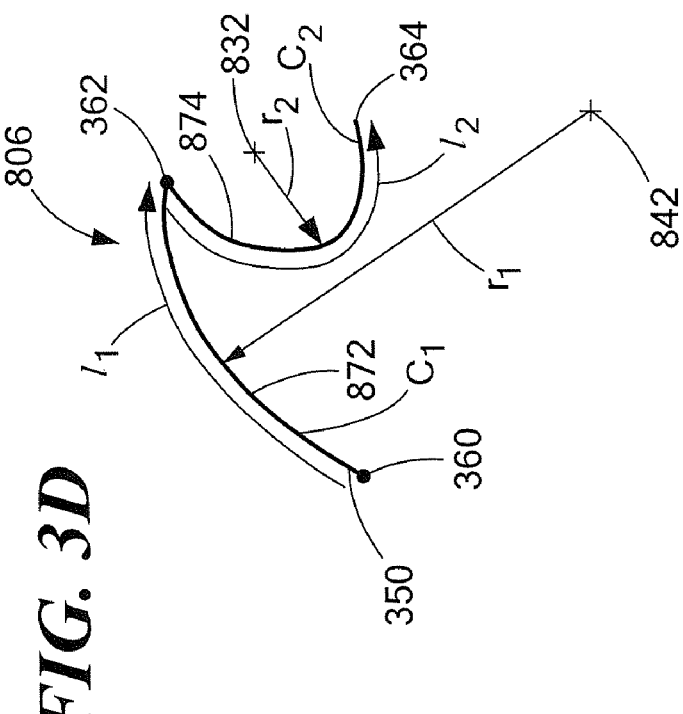
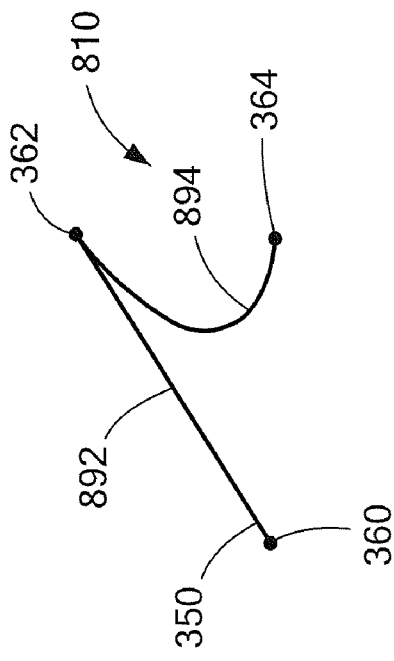
*FIG. 3D*
*FIG. 3E*
*FIG. 3F*

DIRECTION DETECTION SENSOR

FIELD OF THE INVENTION

The inventive techniques and systems generally relate to sensors which use magnetic field transducers to sense movement, and in particular to sensors that include a magnetic field transducer to sense the direction of movement of a target.

BACKGROUND

Sensors or detectors for detecting movement of ferrous or magnetic objects are known. One application for such devices is in detecting the approach and retreat of features of a rotating ferrous object, such as gear teeth or poles of a ring magnet. The magnetic field associated with the ferrous object is often sensed by one or more magnetic field-to-voltage transducers (also referred to herein as magnetic field sensing elements), such as Hall elements or magnetoresistive devices, which provide a signal proportional to a sensed magnetic field (i.e., a magnetic field signal). The sensor processes the magnetic field signal to generate an output signal that changes state each time the magnetic field signal crosses a threshold signal. Therefore, when the sensor is used to detect the approach and retreat of each tooth of a rotating ferrous gear for example, the output signal is a pulse waveform representative of rotation of the ferrous gear and can be used to provide rotational speed information.

Sensors may use a peak-to-peak percentage detector in which the magnetic field signal is compared to a threshold signal that is a percentage of the peak-to-peak magnetic field signal. One such peak-to-peak percentage detector is described in U.S. Pat. No. 5,917,320 entitled "Detection of Passing Magnetic Articles while Periodically Adapting Detection Threshold," which is assigned to the assignee of the present invention.

Sensors may also use a slope-activated or a peak-referenced detector, one type of which is described in U.S. Pat. No. 6,091,239 entitled "Detection of Passing Magnetic Articles with a Peak-Referenced Threshold Detector," which is assigned to the assignee of the present invention. Another such peak-referenced detector is described in U.S. Pat. No. 6,693,419 entitled "Proximity Detector," which is assigned to the assignee of the present invention. In the peak-referenced detector, the threshold signal differs from the positive and negative peaks (i.e., the peaks and valleys) of the magnetic field signal by a predetermined amount. Thus, in this type of proximity detector, the output signal changes state when the magnetic field signal comes away from a peak or valley by the predetermined amount.

In order to accurately detect the ferrous object, the detectors must be capable of closely tracking the magnetic field signal. Typically, one or more digital-to-analog converters (DACs) are used to generate a DAC signal, which tracks the magnetic field signal. For example, in the above-referenced U.S. Pat. Nos. 5,917,320 and 6,091,239, two DACs are used, one to track the positive peaks of the magnetic field signal (PDAC) and the other to track the negative peaks of the magnetic field signal (NDAC). And in the above-referenced U.S. Pat. No. 6,693,419, a single DAC tracks both the positive and negative peaks of the magnetic field signal.

In some applications, it is desirable to detect not only rotation of a target and/or the speed of rotation, but also the direction of rotation. One way of providing a direction signal requires the use of two magnetic field transducers spaced apart from each other. In some such arrangements, the output signals of the two transducers are processed to provide respective pulse signals which are compared to determine the relative phase of the signals which in turn is indicative of the direction of rotation. An example of such an arrangement is a sensor that is sold under a part no. 3422 by Allegro Microsystems, Inc. of Worcester, Mass., the Assignee of the subject application.

Another way of providing a direction signal using only a single magnetic field transducer is described in a Japanese Unexamined Patent Application Publication H2-116753. In this arrangement, the target has an asymmetric shape and a signal provided by a pulse generator is processed by a waveform shaping circuit to detect the direction of rotation based on the polarity of the maximum output value of the voltage generator.

The magnetic field associated with a ferrous object and the resulting magnetic field signal are proportional to the distance between the ferrous object, for example the rotating ferrous gear, and the magnetic field transducer(s). This distance is referred to as the "air gap." As the air gap increases, the magnetic field transducer(s) tend to experience a smaller magnetic field from the ferrous object, and therefore a smaller amplitude magnetic field signal results.

SUMMARY

In accordance with the systems, techniques, and concepts described herein, a sensor responsive to the movement of a detection target includes a magnetic field transducer operative to provide a magnetic field signal proportional to a magnetic field associated with the detection target, a peak detector for tracking positive and negative peaks of the magnetic field signal to generate a tracking signal, and a comparator having a first input responsive to the magnetic field signal, a second input responsive to an input signal related to the tracking signal, and an output at which is provided an output signal comprising first pulses having a first pulse width when the detection target moves in a first direction and second pulses having a second pulse width when the detection target moves in a second direction.

In another aspect, a detection target includes a surface adjacent to and moveable with respect to a magnetic field transducer. The surface includes a first portion extending for a first length from a first location of the surface to a second location of the surface and a second portion extending for a second length from the second location of the surface to a third location of the surface. The second portion forms a recess relative to at least part of the first portion. The first portion and the second portion form a detection feature.

Conventional direction sensing methods often require two or more magnetic field transducers to detect target movement or use complicated or inaccurate signal processing methods. Further, conventional sensors must be installed and maintained at predetermined and precise mounting angles with respect to the target to accurately and reliably detect target movement. Conventional sensors, therefore, may require additional installation procedures to ensure proper orientation, as well as frequent adjustments to maintain proper orientation, which can increase cost and complexity.

With described arrangements, a sensor is provided for detecting the direction movement of a target with a single magnetic field transducer, which can reduce cost and complexity of the sensor. Simple signal processing circuitry provides an accurate sensor output signal that can be used to detect speed and provides a direction signal to indicate direction using different pulse widths. Further, the sensor is insensitive to mounting angle with respect to the target and thus is easily installed and maintained during operation.

BRIEF DESCRIPTION OF THE DRAWINGS

The foregoing features of this invention, as well as the invention itself, may be more fully understood from the following description of the drawings in which:

FIGS. 3A, 3B, 3C, 3D, 3E, and 3F show pictorial representations of various detection target embodiments in accordance with the invention;

DETAILED DESCRIPTION

Figure 1A:
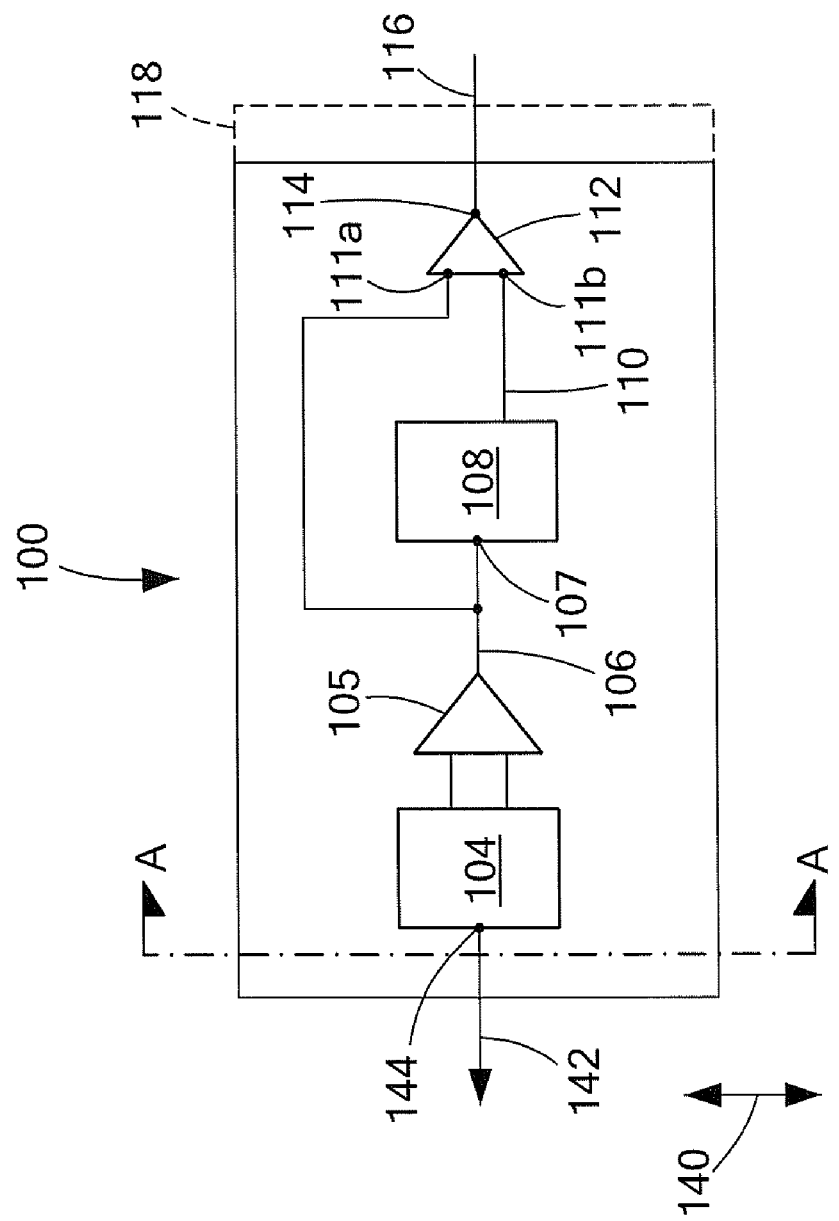
FIG. 1A is a pictorial representation of a detection target and a sensor for detecting direction of movement of the detection target in accordance with the invention.
Figure 1A:
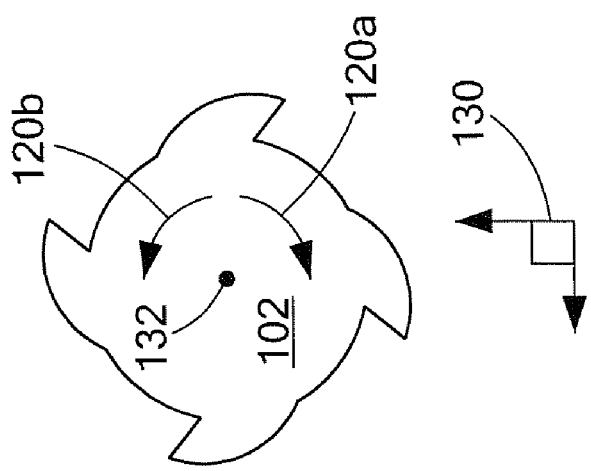
Figure 1B:
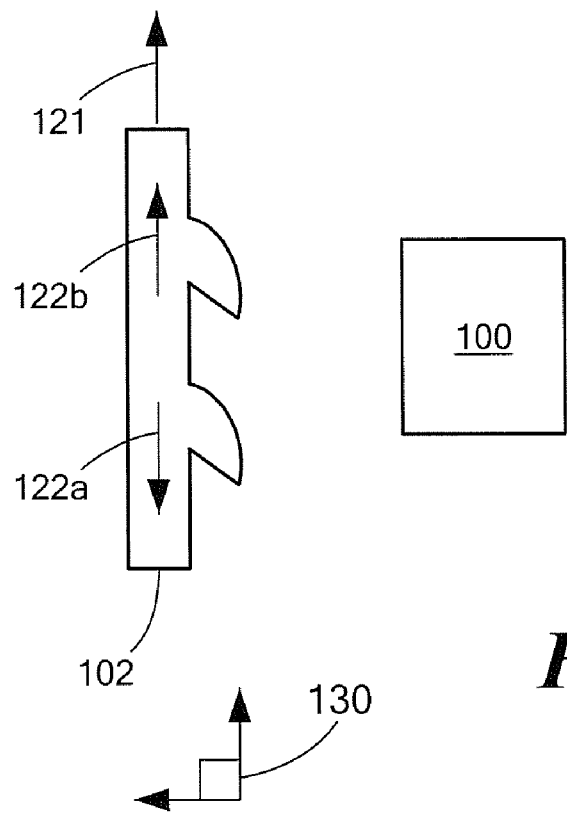
FIG. 1B is a pictorial representation of a detection target characterized by translational movements for use with a sensor of the type shown in FIG. 1A.

Referring to FIG. 1, a sensor 100 responsive to movement of a detection target 102 includes a magnetic field transducer 104, a peak detector 108, and a comparator 112. The magnetic field transducer 104 is operative to provide a magnetic field signal 106 proportional to a magnetic field associated with the detection target 102. The magnetic field signal 106 is provided as an input 107 to the peak detector 108 that tracks positive and negative peaks of the magnetic field signal 106. An amplifier 105 may be coupled between the magnetic field transducer 104 and the peak detector 108 to amplify the magnetic field signal 106 and optionally to implement other features, such as automatic gain control (AGC) and offset adjustment.

The sensor 100 further includes a comparator 112 having a first input 111a responsive to the magnetic field signal 106 and a second input 111b responsive to a tracking signal 110 generated by the peak detector 108. The comparator 112 has an output 114 at which is provided an output signal 116 having first pulses with a first pulse width when the detection target 102 moves in a first direction 120a and second pulses with a second pulse width when the detection target 102 moves in a second direction 120b.

Advantageously, the sensor output signal 116 can be provided with the use of only a single magnetic field transducer 104. This arrangement simplifies circuit design and reduces circuit size and cost in contrast to conventional direction detection sensors utilizing two spaced magnetic field transducers for example.

The sensor 100 detects target movement in first and second directions 120a, 120b representing rotational movement directions of the detection target 102 in a plane 130. For example, the first direction 120a may be characterized by a clockwise rotation about an axis of rotation 132 and the second direction 120b may be characterized by a counter-clockwise rotation about the axis of rotation 132.

It will be understood that the sensor 100 can detect other detection target movements. For example, referring to FIG. 1B in which like elements of FIG. 1A are shown with like reference numerals, the sensor 100 can detect target movement in a first direction 122a and a second direction 122b representing translational movements of the detection target 102 positioned in a plane 130 along a translational axis 121. It will be further understood that the sensor may also detect other target movements, such as combinations of rotational and translational movements, including movements in multiple planes and/or along multiple axes.

Referring again to FIG. 1A, the detection target 102 is positioned in a target plane 130 and, in embodiments in which the detection target rotates, is rotatable about an axis of rotation 132. The sensor 100 is mountable in a mounting plane 140 with a center 144 of the magnetic field transducer 104 positioned along a mounting axis 142. The sensor 100 may be mounted to a stationary mounting structure by various techniques. For example, screws may be used to mount the sensor into a mounting plate. It will be further understood that other methods of mounting the sensor may be used including, but not limited to, a key and pin arrangement, mounting slots, and fastening using epoxy, glue, rivets, or solder.

According to an aspect of the invention described further below, operation of the sensor to provide an output signal indicative of the direction of target movement is insensitive (i.e., unaffected) to the angle at which the sensor is mounted in the mounting plane. In other words, the sensor will operate to provide the same direction detection signal regardless of the angle of the sensor relative to the mounting axis 142 (FIG. 1A). Significantly, this feature allows for increased tolerances in the positioning of the sensor relative to the mounting axis.

Figure 1C:
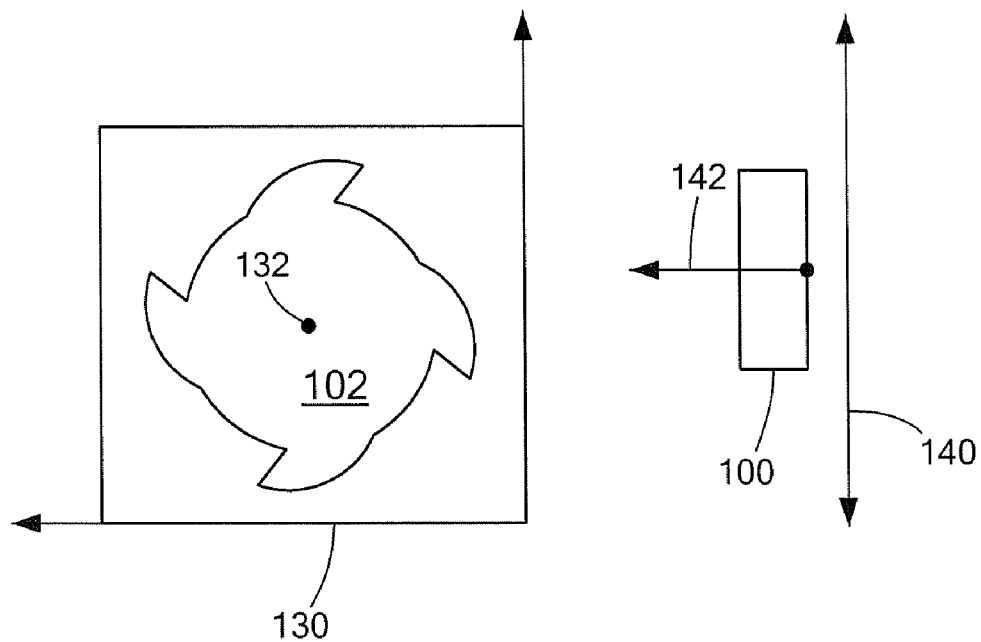
FIG. 1C is a pictorial representation of a detection target and a sensor of the type shown in FIG. 1A with the detection target positioned in a plane substantially orthogonal to the plane of the sensor.
Figure 1D:
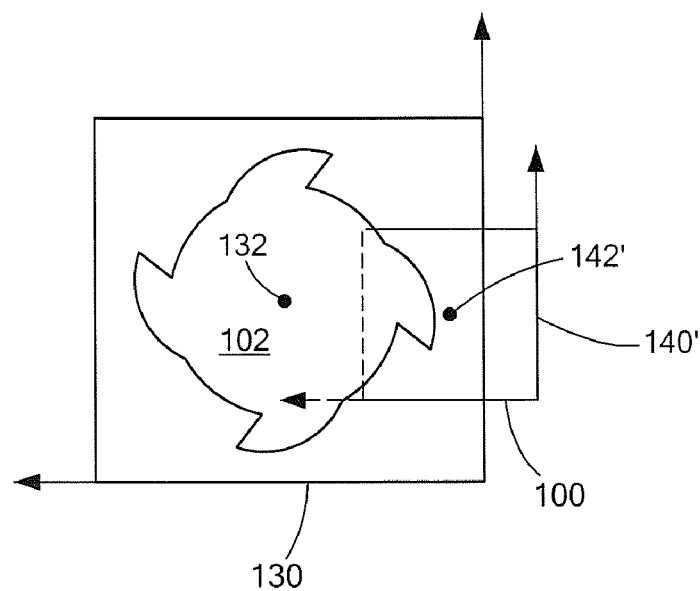
FIG. 1D is a pictorial representation of a detection target and a sensor of the type shown in FIG. 1A with the detection target positioned in a plane substantially parallel to the plane of the sensor.

Referring now to FIG. 1C showing a similar arrangement of the sensor 100 and detection target 102 of FIG. 1A, the mounting plane 140 may be substantially orthogonal to the target plane 130 and the mounting axis 142 may be substantially orthogonal to the axis of rotation 132 of the detection target. In another embodiment shown in FIG. 1D, in which like elements of FIG. 1A are shown with like reference numerals, the mounting plane 140' is substantially parallel to the target plane 130 and the mounting axis 142' is substantially parallel to the axis of rotation 132 of the detection target 102.

Figure 1E:
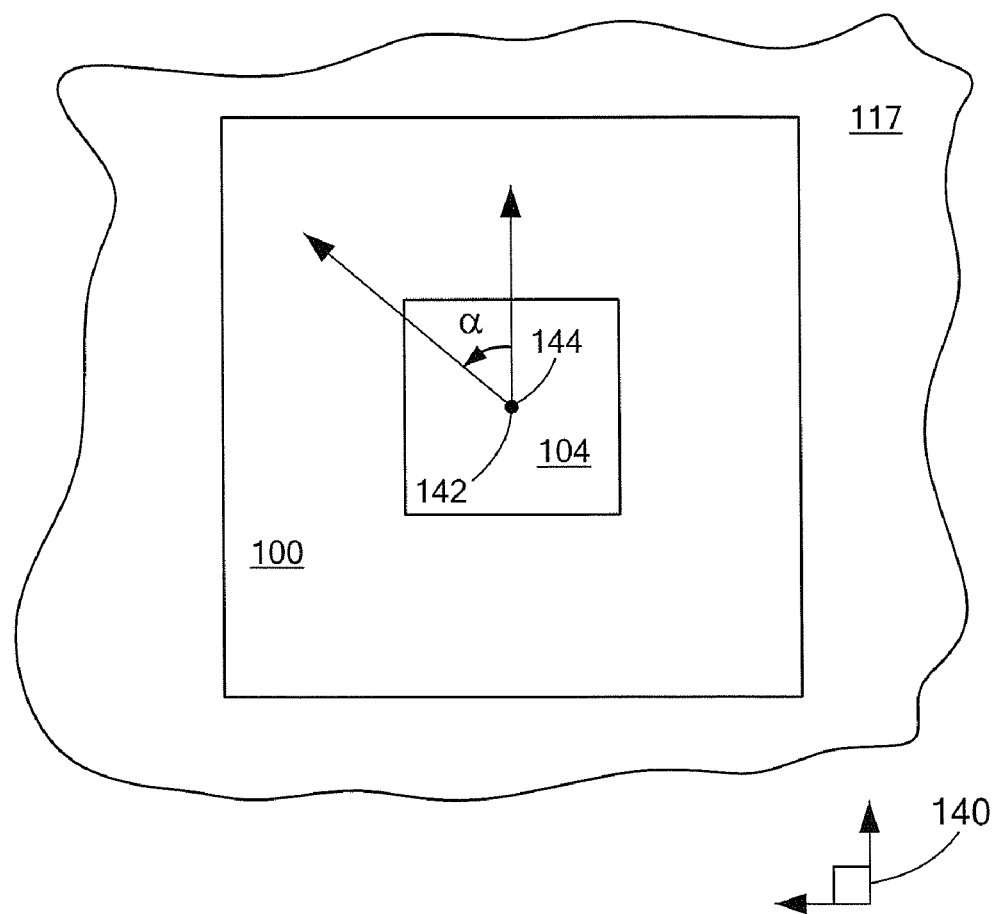
FIG. 1E is a pictorial representation of the sensor taken along view line AA of FIG. 1A, with the sensor mounted to a mounting plate to illustrate the insensitivity of the sensor to mounting angle.

Referring now to FIG. 1E, a view of the sensor 100 of FIG. 1A at view line AA of FIG. 1A shows the sensor 100 mounted to a mounting plate 117 with the center 144 of the transducer 104 positioned along the mounting axis 142. According to the invention, the sensor 100 can be mounted such that the magnetic field transducer 104 can be positioned at any angle α with respect to the mounting axis 142. Advantageously, the magnetic field transducer 104 responds in substantially the same manner to a magnetic field associated with movement of a detection target, regardless of the mounting angle α. Such insensitivity to mounting angle can simplify sensor installation and maintenance, since burdensome procedures to install the sensor at a predetermined alignment (and to maintain the sensor at the predetermined alignment) are unnecessary. For example, a user may install the sensor 100 by screwing it into the mounting plate 117 until secure, without worrying about the sensor's resting orientation with respect to the detection target.

The magnetic field transducer 104 may be a magnetic field-to-voltage transducer or a magnetic field-to-current transducer. Furthermore, various types of magnetic field-to-voltage transducers are suitable including, but not limited to, Hall effect elements and magnetoresistance elements, such as a giant magnetoresistance element, or an anisotropic magnetoresistance element.

In another embodiment, the sensor may further include a back-bias magnet 118 (shown in FIG. 1A as an optional element). The back-bias magnet 118 may be mounted on a side of the sensor opposing the detection target. The back-bias permanent magnet 118 generates a magnetic field for certain detection targets that do not generate a field themselves, such as certain soft ferromagnetic targets.

Figure 2:
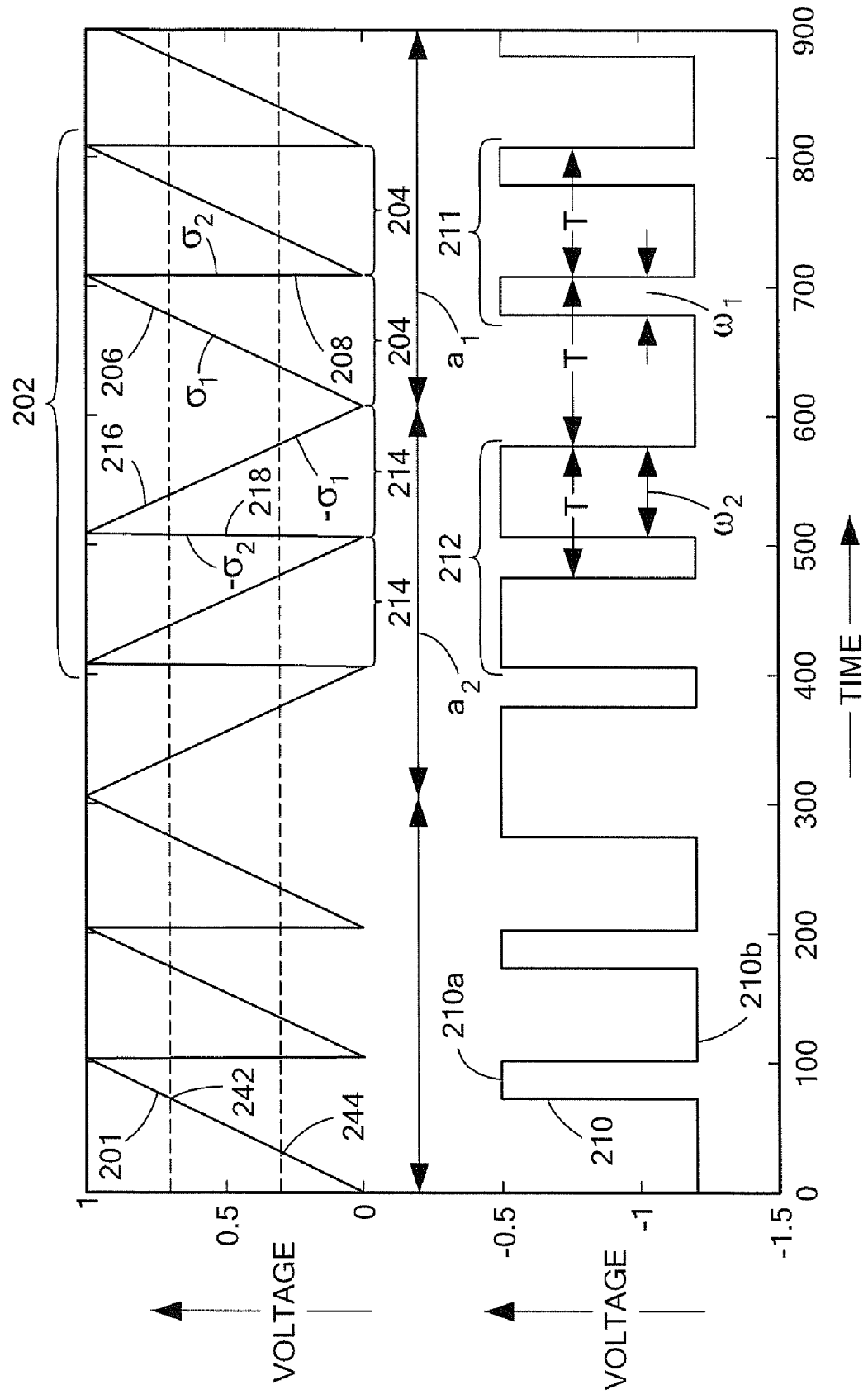
FIG. 2 shows illustrative waveforms of a magnetic field signal and a pulse output signal associated with the sensor of FIG. 1A.

Referring now to FIG. 2, an illustrative magnetic field signal 201 is shown, as may be like signal 106 provided by the sensor 100 of FIG. 1A in response to movement of a detection target, such as rotation of the target 102 of FIG. 1A. The magnetic field signal 201 may be a voltage signal. It will be understood, however, that the magnetic field transducer may provide other forms of magnetic field signals including, but not limited to, a current signal.

The magnetic field signal 201 is proportional to a magnetic field associated with a detection target. In particular, the magnetic field is associated with movement of the detection target. For example, the detection target may rotate in a clockwise or counter-clockwise direction, each producing different time-varying magnetic fields. Moreover, various features and shapes of the detection target, such as protruded portions or depressed portions, respectively, increase or decrease an amount of ferrous material to concomitantly increase or decrease the strength of the magnetic field to which the sensor is exposed. As will be explained, the air gap between the detection target and sensor also affects the magnetic field signal.

At least a portion of the magnetic field signal 201 includes a sawtooth waveform 202 produced in response to a magnetic field associated with movement of the detection target. The sawtooth waveform 202 includes cycles 204 having a first portion 206 and a second portion 208. The first portion 206 has a first slope $\sigma_1$, and the second portion 208 has a second slope $\sigma_2$ different than the first slope $\sigma_1$. As can be seen from FIG. 2, other cycles 214 may have a first portion 216 and a second portion 218 also characterized by respective first and second slopes. For example, a first portion 216 of cycle 214 may be characterized by a slope that is equal to but opposite in polarity with respect to slope $\sigma_1$ of first portion 206 in cycle 204. Further, a second portion 218 of cycle 214 may be characterized by a slope that is equal to but opposite in polarity with respect to slope $\sigma_2$ of second portion 208 in cycle 204.

Figure 2A:
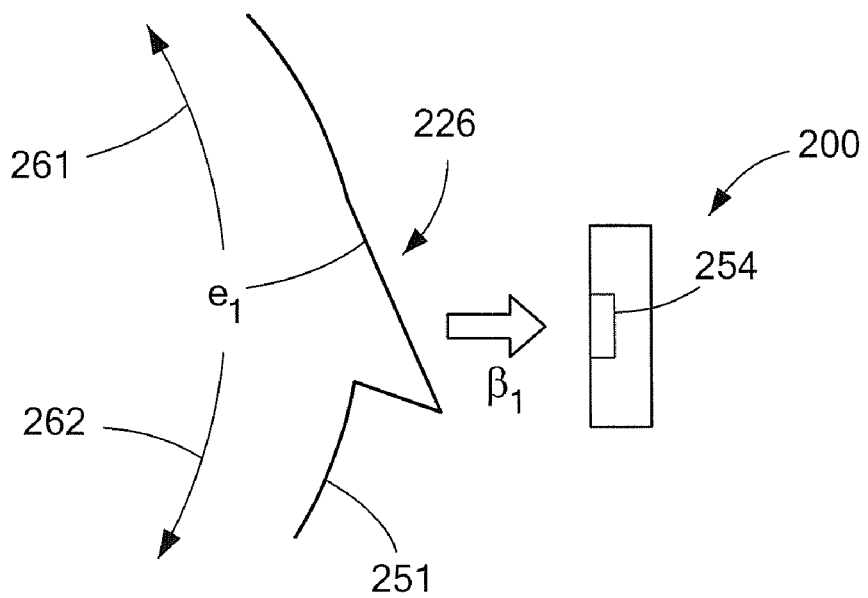
FIG. 2A is a pictorial representation of a portion of a rotating detection target to be sensed by a sensor of the type shown in FIG. 1A.
Figure 2B:
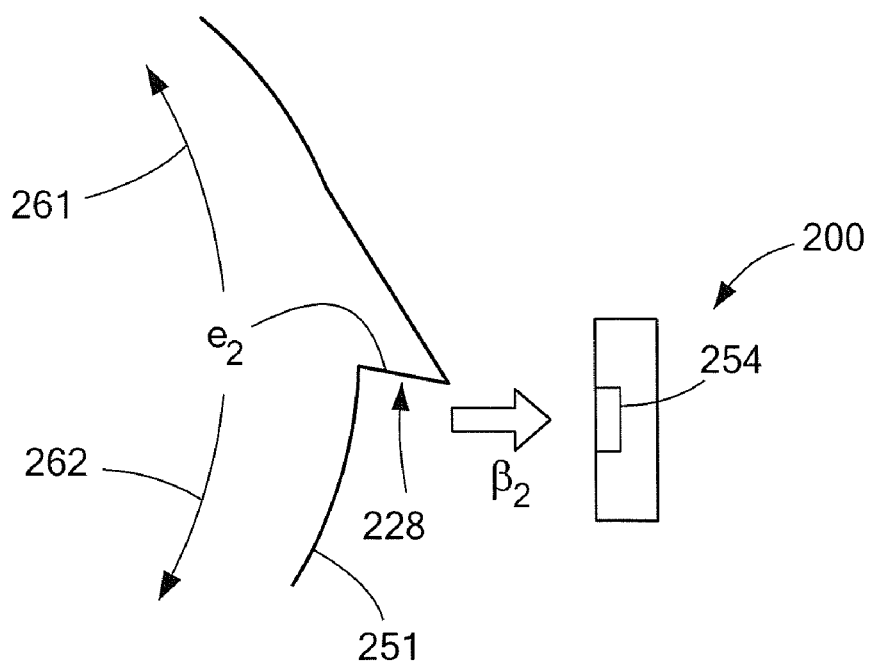
FIG. 2B is a pictorial representation of another portion of the rotating detection target to be sensed by the sensor of FIG. 1A.

Referring also to FIGS. 2A and 2B, illustrative sensor and detection target arrangements for providing the signals of FIG. 2 are shown. Different portions of the sawtooth waveform 202 are produced by different respective portions of the moving detection target 251. In particular, the first portion 206 of cycle 204 represents a response of a magnetic field transducer 254 of a sensor 200 to a magnetic field $\beta_1$ produced by a first profile 226 of detection target 251. At least a portion of the first profile 226 has a first sloped edge $e_1$ producing changes in the magnetic field $\beta_1$ as the sloped edge $e_1$ moves past the magnetic field transducer 254.

Referring also to FIG. 2B, a second portion 208 of cycle 204 represents a response of the magnetic field transducer 254 to a magnetic field $\beta_2$ produced by a second profile 228 of the detection target 251. At least a portion of the second profile 228 has a second sloped edge $e_2$ producing changes in the magnetic field $\beta_2$ as the sloped edge $e_2$ moves past the magnetic field transducer 254. It can be seen, therefore, that when the detection target 251 is rotated in direction 261, successive first and second profiles 226, 228 can produce successive first and second portions 206, 208 of cycle 204 of the sawtooth waveform 202. Alternatively, if the detection target is rotated in a direction opposite to direction 261, in direction 262, successive second and first profiles 228, 226 can produce successive second and first portions 218, 216 of cycle 214 of the sawtooth waveform 202.

Also shown in FIG. 2 is an exemplary sensor output signal 210, as may be provided at the output 114 of the comparator 112 of FIG. 1A. Output signal 210 includes first pulses 211 having a first pulse width $\omega_1$ and the second pulses 212 having a second pulse width $\omega_2$. The first and second pulses 211, 212 are indicative of movement of a detection target in respective first and second directions. For example, the output signal 210 provides the first pulses 211 when the detection target moves in a first direction as occurs during a time interval labeled $a_1$ and the second pulses 212 when the detection target moves in a second direction as occurs during a time interval labeled $a_2$. In this way, it is possible to distinguish between first and second directions of movement of the detection target by detecting the outputted pulse widths 211, 212. For example, an external circuit or processing system can detect one or more of the pulse widths, determine a direction of movement of the detection target, and respond accordingly. In particular, the inventive systems and techniques may be used in an automotive environment to detect forward or reverse directions of mechanical components of an automobile which may form at least part of the detection target, such as gears, discs, drums, and shafts. Alternatively, a detection target may be configured to move in concert with the mechanical components such that corresponding movements of the detection target may be sensed by the sensor.

Referring again to FIG. 1A and as noted above, the first input 111a of the comparator 112 is responsive to the magnetic field signal 106 and the second input 111b of the comparator 112 is responsive to an input signal related to the tracking signal 110. In particular, the comparator output signal 210 (FIG. 2) transitions to a first binary signal level 210a when the magnetic field signal 106 rises to exceed a first threshold signal level 242 and transitions to a second binary signal level 210b when the magnetic field signal falls to below a second threshold signal level 244, so as to provide hysteresis to the comparator.

As will become apparent, how the first and second threshold signal levels 242, 244 are established and how the input signal to the comparator input 111b relates to the tracking signal 110 depends on the type of peak detector 108 (FIG. 1A). For example and as described in connection with FIG. 5, in a peak-to-peak percentage detector, the first threshold signal level 242 is provided to the comparator input 111b as a first percentage of the peak-to-peak magnetic field signal and the second threshold signal level 244 is provided to the comparator input 111b as a second percentage of the peak-to-peak magnetic field signal. Whereas, in a peak-referenced detector such as the one shown in FIG. 6A, the comparator input signal is substantially equal to the magnetic field signal and hysteresis is implemented internal to the comparator 112. In this embodiment, the first threshold signal level 242 is an offset amount from positive peaks of the tracking signal and the second threshold signal level 244 is an offset amount from negative peaks of the magnetic field signal, such that the comparator output signal 210 transitions when the magnetic field signal 106 differs from the tracking signal by the offset amount.

Thus, when the detection target 251 (FIGS. 2A and 2B) rotates in the direction of arrow 261 resulting in a magnetic field signal cycle 204, the detector output signal 210 transitions to the first binary signal level 210a when the magnetic field signal rises to exceed the first threshold signal level 242 and transitions to the second binary signal level 210b when the magnetic field signal falls to below the second threshold signal level 244, as shown. The result of the detection target rotation in the direction 261 is thus a pulse 211 (or more such pulses corresponding to more target features including first and second profiles 226, 228). Likewise, when the detection target 251 rotates in the opposite direction indicated by arrow 262, resulting in a magnetic field signal cycle 214, the detector output signal 210 transitions to the first binary signal level 210a when the magnetic field signal rises to exceed the first threshold signal level 242 and transitions to the second binary signal level 210b when the magnetic field signal falls to below the second threshold signal level 242, as shown. However, given the characteristics of the magnetic field signal cycle 214, the result of detection target rotation in the direction 262 is thus a pulse 212 (or more such pulses corresponding to more target features including first and second profiles 226, 228).

It will be understood, however, that the result of the target rotation in various directions, such as directions 261 and 262 may be determined from the output signal 210 in ways other than by detection of the first and second pulse widths 211 and 212. For example, duty cycle $D_c$ may be used to detect the direction of detection target movement. The duty cycle $D_c$ can be defined as a ratio of a duration τ of first binary signal level 210a or second binary signal level 210b over a period T (labeled in FIG. 2) of an entire cycle including first and second binary levels 210a and 210b. Duty cycle, unlike pulse width, is independent of the speed of target movement. Duty cycle can be measured with a timing circuit or, alternatively, by filtering the signal (i.e., integrating the signal) and taking a DC value of the filtered signal.

Figure 3A:
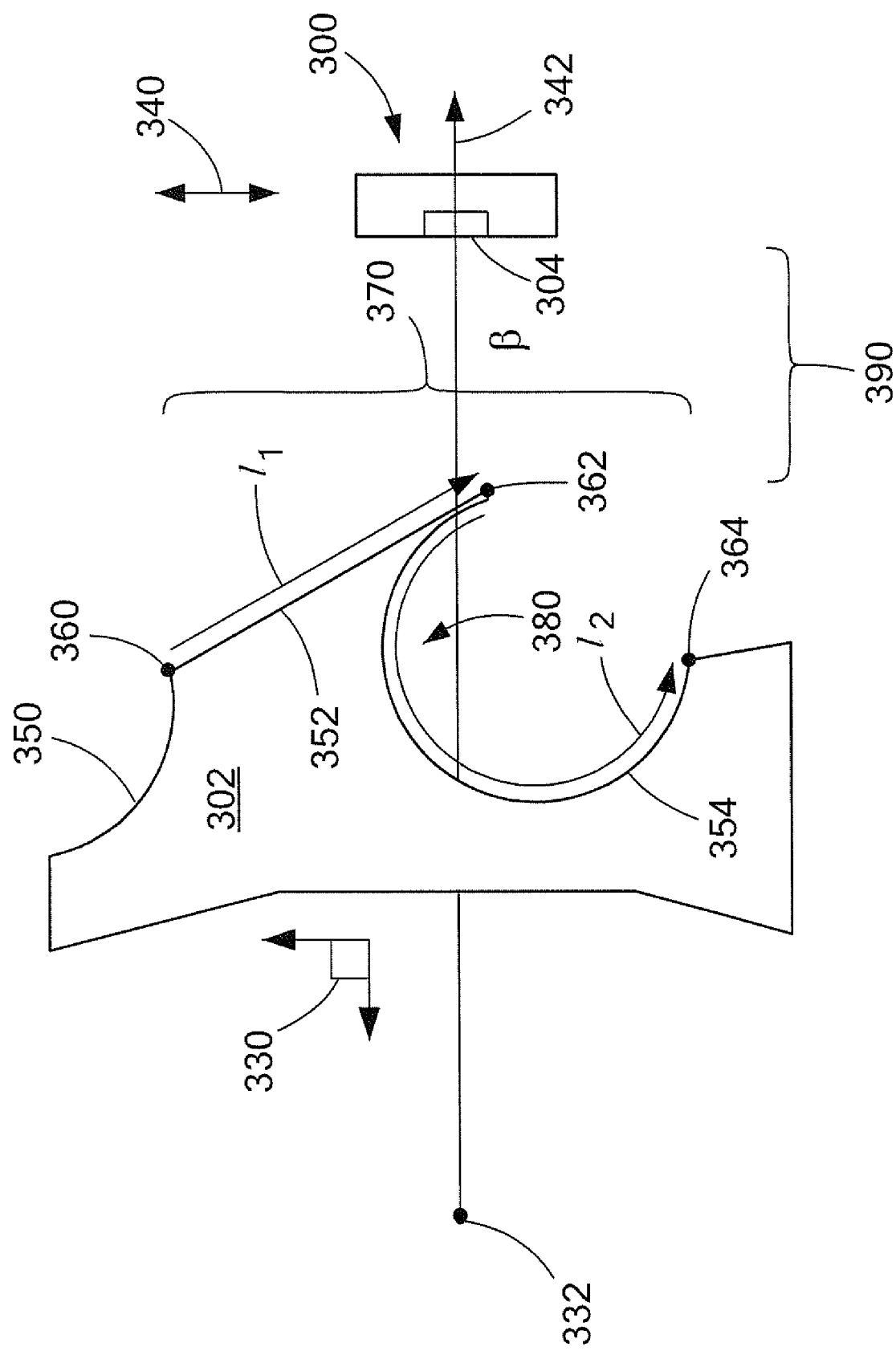

Referring now to FIG. 3A, a detection target 302 includes a surface 350 adjacent to and moveable with respect to a magnetic field transducer 304 of a sensor 300, which may be like transducer 104 of sensor 100. The surface 350 includes a first portion 352 extending for a first length $l_1$ from a first location 360 of the surface 350 to a second location 362 of the surface 350, and a second portion 354 extending for a second length $l_2$ from the second location 362 of the surface 350 to a third location 364 of the surface 350. The second portion 354 forms a recess 380 relative to at least part of the first portion 352. The first portion 352 and the second portion 354 provide a detection feature 370, as will be explained.

The detection feature 370 of the detection target 302 affects a magnetic field β associated with the detection target 302 and sensed by the sensor 300 positioned in the vicinity of the detection target 302. As the detection target 302 moves, for example, by clockwise or counter-clockwise rotation about an axis of rotation 332, different portions of the detection feature 370 (for example, first and second portions 352 and 354) pass by the sensor 300, affecting the strength of the magnetic field β experienced by the magnetic field transducer 304.

The strength of the magnetic field β at center line 342 is influenced by the area and shape of the detection target 302 in the vicinity of the center line 342. For example, as first location 360 moves past center line 342 in a counter-clockwise direction and first portion 352 becomes closer and closer to transducer 304, the magnetic field β increases in strength and the magnetic field transducer 304 produces a proportionally increased response. Further, as second location 362 rotates past the center line 342 and second portion 354 cuts away from the transducer 304, including at recess 380, the magnetic field β decreases in strength, and the magnetic field transducer 304 produces a proportionally decreased response.

The response of the magnetic field transducer 304 is also influenced by the air gap 390 between the sensor 300 and the detection target 302. In particular, larger air gaps tend to increase the magnetic reluctance, thereby reducing the resulting magnetic field signal amplitude.

The frequency of the detection features 370 refers to the number of detection features 370 over a given length of the surface 350. The larger the frequency, the larger the number of detection features, and generally the smaller the overall length of each detection feature.

It will be appreciated by those of ordinary skill in the art that the size, shape, and frequency of the portions 352, 354 may be selected in order to optimize the detection target design for a given application with consideration given to the installation air gap 390 and other factors, such as the material of the detection target. These factors and their tradeoffs are useful in designing the detection target. For example, in larger air gap installations, the frequency of the detection features may be decreased (and the length of the detection features 370 increased) to counteract the air gap effects. Alternatively, the frequency of the detection features 370 may be increased (and the length of the detection features 370 decreased) for smaller air gap installations.

Figure 3B:
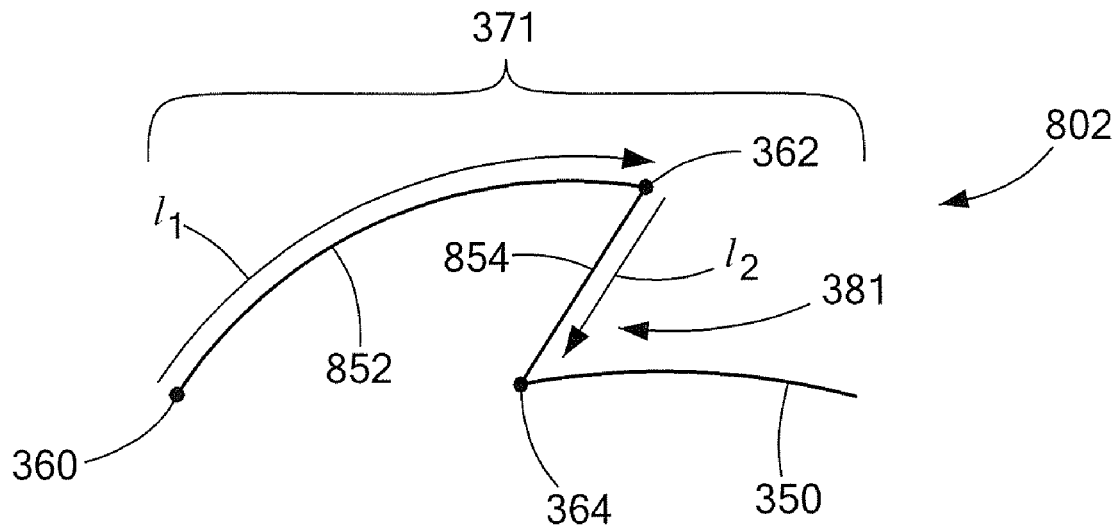

It will be further appreciated that detection target 302 is not limited to the particular shapes described above and shown in FIG. 3A. Most generally, the first and second portions 352, 354 can be substantially concave, substantially convex, substantially straight, or a combination thereof. Referring to FIG. 3B in which like elements of FIG. 3A have like reference designations, a further detection target embodiment 802 includes a first portion 852 extending for a first length $l_1$ from a first location 360 of the surface 350 to a second location 362 of the surface 350, and a second portion 854 extending for a second length $l_2$ from the second location 362 of the surface 350 to a third location 364 of the surface 350. The second portion 854 forms a recess 381 relative to at least part of the first portion 852. In the embodiment of FIG. 3B, the first portion 852 is substantially convex and the second portion 854 is substantially straight.

Figure 3C:
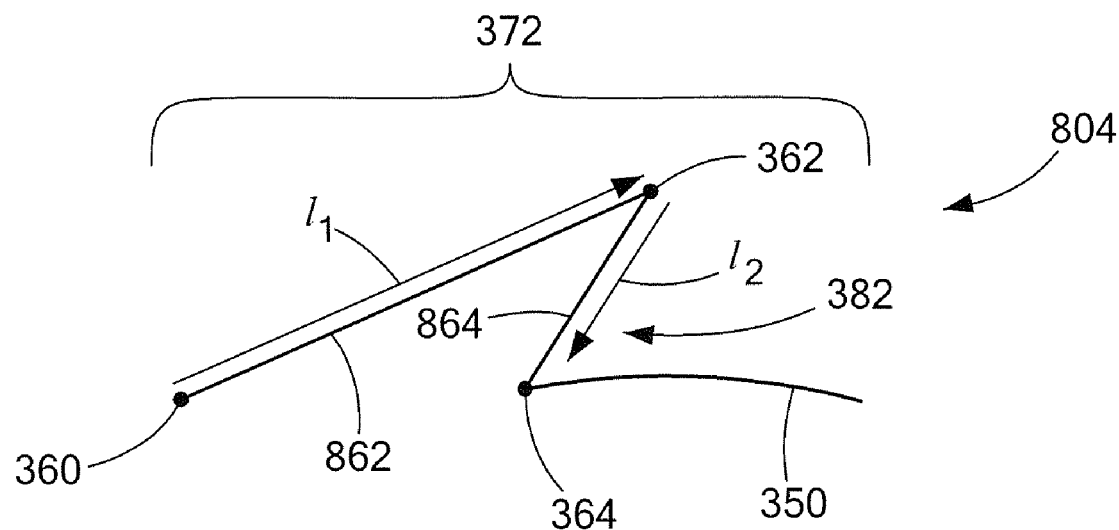

Referring to FIG. 3C in which like elements of FIG. 3A have like reference designations, a further detection target embodiment 804 includes a first substantially straight portion 862 extending for a first length $l_1$ from a first location 360 of the surface 350 to a second location 362 of the surface 350, and a second substantially straight portion 864 extending for a second length $l_2$ from the second location 362 of the surface 350 to a third location 364 of the surface 350. The second portion 864 forms a recess 382 relative to at least part of the first portion 862.

Referring now to FIG. 3D, a detection target embodiment 806 includes a first portion 872 extending for a first length $l_1$ from a first location 360 of the surface 350 to a second location 362 of the surface 350, and a second portion 874 extending for a second length $l_2$ from the second location 362 of the surface 350 to a third location 364 of the surface 350. The first portion 872 is characterized by a first convex curve $C_1$ having a first radius of curvature $r_1$ and the second portion 874 is characterized by a second curve $C_2$ having by a second radius of curvature $r_2$ which is smaller than first radius of curvature $r_1$. Radius of curvature $r_1$ extends from the center point 842 of a phantom circular area (not shown) the circumference of which forms at least a portion of the first convex curve $C_1$. Radius of curvature $r_2$ extends from the center point 832 of a phantom circular area (not shown) the circumference of which forms at least a portion of the second curve $C_2$.

Referring now to FIG. 3E, an alternative detection target embodiment 808 includes a first portion 882 extending for a first length $l_1$ from a first location 360 of the surface 350 to a second location 362 of the surface 350, and a second portion 884 extending for a second length $l_2$ from the second location 362 of the surface 350 to a third location 364 of the surface 350. The first portion 882 is characterized by a first concave curve $C_1$ having a first radius of curvature $r_1$ and a second portion 884 is characterized by a second curve $C_2$ having a second radius of curvature $r_2$ which is smaller than first radius of curvature $r_1$. Radius of curvature $r_1$ extends from the center point 843 of a phantom circular area (not shown) the circumference of which forms at least a portion of the first concave curve $C_1$. Radius of curvature $r_2$ extends from the center point 833 of a phantom circular area (not shown) the circumference of which forms at least a portion of second curve $C_2$.

Referring to FIG. 3F, a detection target embodiment 810 includes first portion 892 that is substantially straight from first location 360 to second location 362 of the surface 350. A second portion 894 of detection target 810 is substantially concave from second location 362 to third location 364 of the surface 350.

Suitable detection target materials include, but are not limited to, steel 1008, steel 1010, Permalloy, other soft ferromagnetic materials, including non-ferrous soft ferromagnetic materials such as NiCo alloys, and NiFe alloys.

More generally, detection targets suitable for use with the sensor 100 of FIG. 1A for example, are asymmetrical in the sense that they do not have the same magnetic profile when the detection target moves in one direction as when the detection target moves in second, different direction. With this arrangement, the resulting magnetic field signal, such as signal 201 of FIG. 2, will have different cycles with asymmetrical characteristics, such as cycles 204 and 214 in FIG. 2, corresponding to the different directions of target movement. Such a magnetic field signal will result in a comparator output signal, such as signal 210 of FIG. 2 that includes different pulse widths corresponding to the different directions of target movement.

It should be understood that detection targets suitable for use with sensor 100 of FIG. 1A can enable detection of target movement in multiple planes and/or along multiple axes. As an example, one of four modes of translational movement may be enabled with a target design incorporating rectangular two dimensional features sloped in height. Such an arrangement can produce four different output pulse widths corresponding to the four directions of translational movement. This can be extended to provide a continuum of pulse widths to represent directional movement over a continuous set of planes. System tolerances would have to be maintained to provide accurate output.

Figure 4:
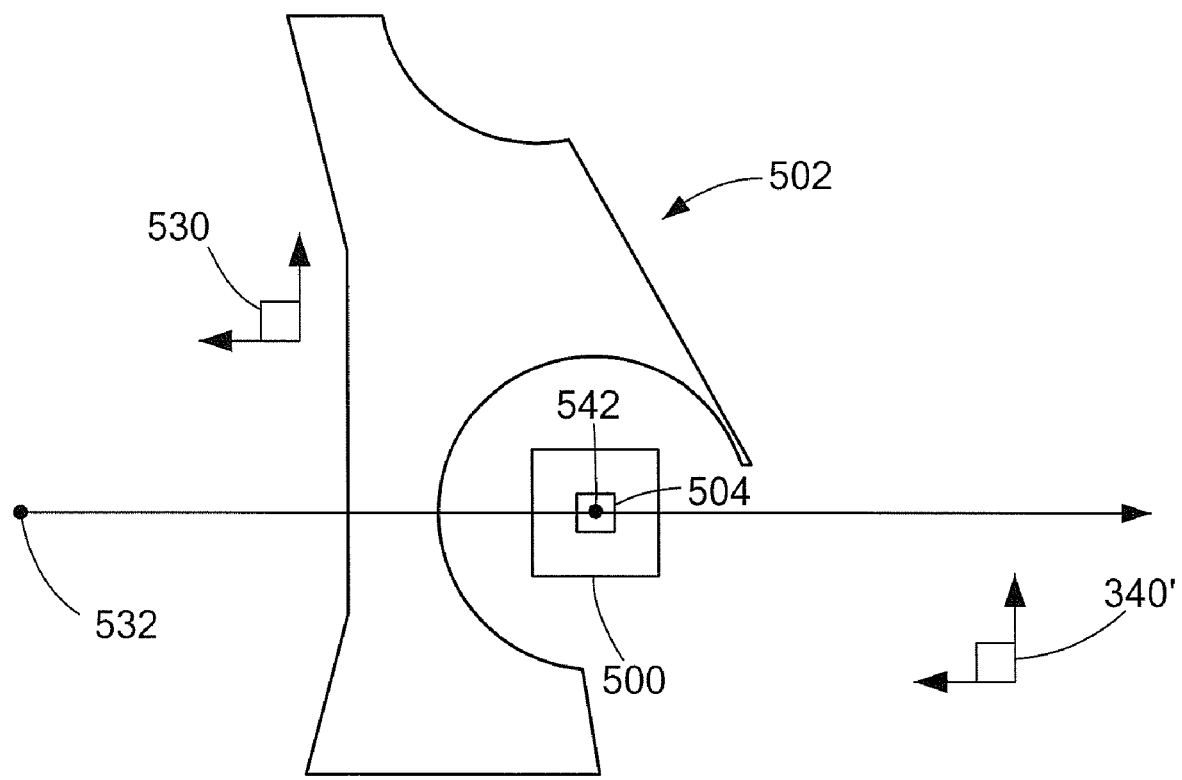
FIG. 4 is a pictorial representation of the detection target embodiment of FIG. 3A with a sensor mounted in a plane substantially parallel to the plane of the detection target.

The detection target arrangement of FIG. 3A is configured similarly to the embodiment of FIG. 1C in that the mounting plane 340 in which the transducer 304 is positioned is substantially orthogonal to the target plane 330 in which the detection target 302 is positioned. In an alternative configuration shown in FIG. 4, the detection target 502 is positioned in the target plane 530 and rotates about axis of rotation 532. The magnetic field transducer 504 of the sensor 500 is positioned in mounting plane 340' and is centered about mounting axis 542. The mounting plane 340' is substantially parallel to the target plane 530 and the mounting axis 542 is substantially parallel to the axis of rotation 532.

Figure 5:
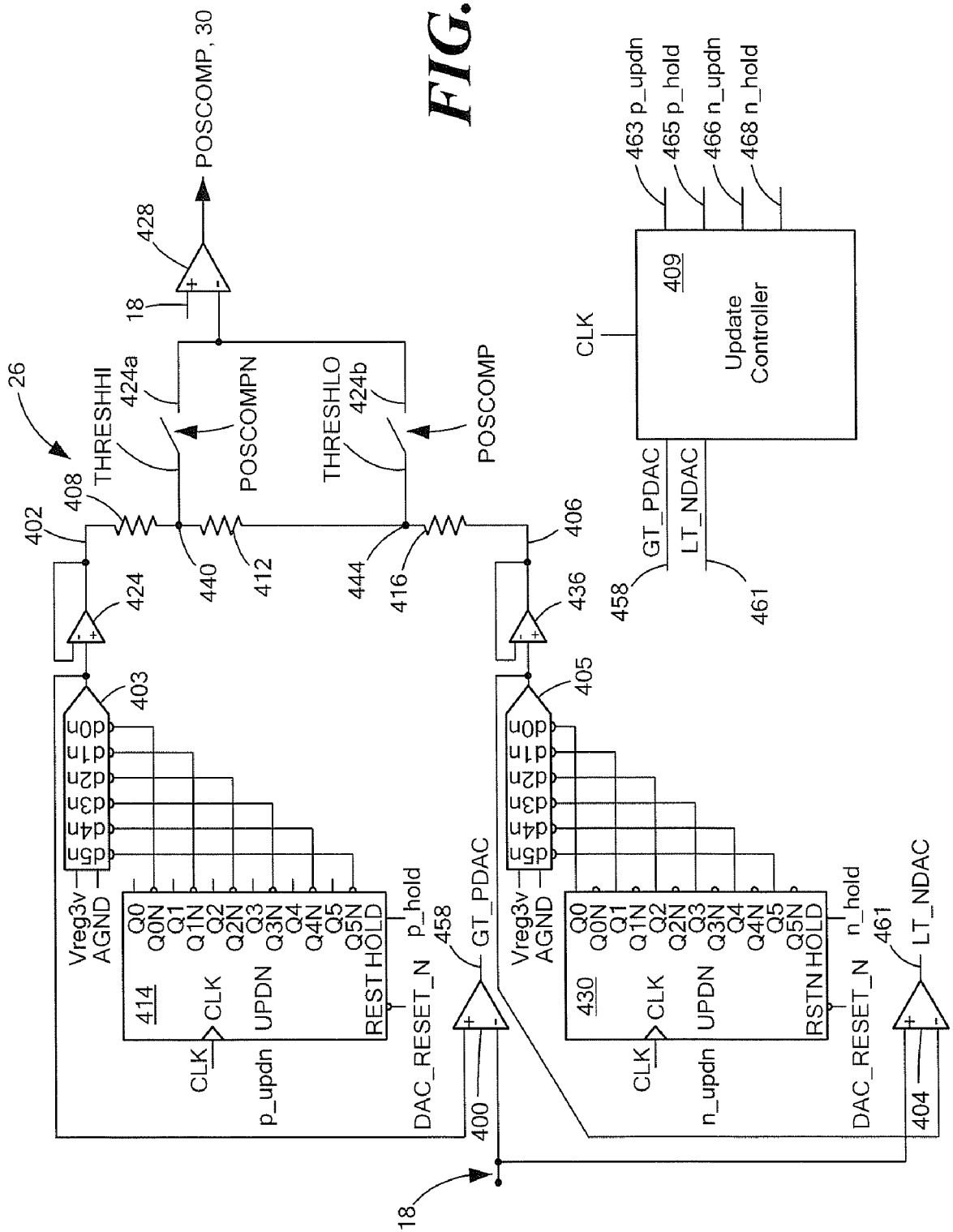
FIG. 5 is a block diagram of an illustrative peak-to-peak percentage detector for use in the sensor of FIG. 1A.

Various types of peak detectors 108 (FIG. 1A) are suitable for the sensors described herein. FIG. 5 shows an illustrative peak-to-peak percentage detector 26 coupled to a comparator 428, like comparator 112 of FIG. 1A, that provides a detector output signal 30, like output signal 116 of FIG. 1A. A magnetic field signal 18, like signal 106 of FIG. 1A, is provided as an input to the detector 26.

Magnetic field signal 18 is applied to a non-inverting input of a first comparator 400 and to the inverting input of a second comparator 404. The output signals of comparators 400 and 404 provide input signals GT_PDAC 458 and LT_NDAC 461, respectively, to an update controller 409 that provides control signals to counters 414 and 430, as shown.

The update controller 409 provides a p_updn signal 463 to an UPDN input of a counter 414 to control the count direction. As will become apparent, the p_updn signal 463 normally causes the counter 414 to count up. Under certain conditions however, the p_updn signal 463 causes the counter 414 to count down for a single clock cycle. The counter 414 is clocked by a system clock signal, CLK. A p_hold signal 465 is coupled to a HOLD input of the counter 414. The counter output is held constant (i.e., the counter is disabled) when the HOLD input signal is at a first logic level and is released (i.e., the counter is enabled) when HOLD input signal is at a second logic level. The counter 414 may be a six bit counter which is enabled when the HOLD input is low. The counter 414 is reset by a DAC_RESET_N signal, which may be established in response to an AGC circuit such that the counter 414 is reset whenever an AGC counter is incremented.

The outputs of the counter 414 are coupled to inputs of a Positive Digital-to-Analog Converter (PDAC) 403. The PDAC 403 is buffered by a buffer 424 to provide a PDAC signal, which may be a voltage 402 that tracks the positive peaks of the magnetic field signal 18 (i.e., the tracking signal).

The comparator 400, counter 414, PDAC 403, and buffer 424 comprise a "positive portion" of the detector circuitry. A "negative portion" of the detector 26 is similarly arranged, as shown. In particular, update controller 409 provides an n_updn signal 466 to an UPDN input of counter 430 to control the count direction. As will become apparent, the n_updn signal 466 normally causes the counter 430 to count down. Under certain conditions however, the n_updn signal 466 causes the counter 430 to count up for a single clock cycle. The counter 430 is clocked by a system clock signal, CLK. An n_hold signal 468 is coupled to a HOLD input of the counter 430. The counter output is held constant (i.e., the counter is disabled) when the HOLD input signal is at a first logic level and is released (i.e., the counter is enabled) when the HOLD input signal is at a second logic level. The counter 430 may be a six bit counter which is enabled when the HOLD input is low. The counter 430 is reset by the DAC_RESET_N.

The outputs of the counter 430 are coupled to inputs of a Negative Digital-to-Analog Converter (NDAC) 405. The NDAC 405 is buffered by a buffer 436 to provide an NDAC signal, which may be a voltage 406 that tracks the negative peaks of the magnetic field signal 18 (i.e., the tracking signal).

The buffered PDAC and NDAC voltages are coupled to a resistor divider comprising series-coupled resistors 408, 412, and 416 in order to generate threshold signals THRESHHI and THRESHLO, as may correspond to threshold signal levels 242, 244 of FIG. 2.

Each of the threshold signals THRESHHI and THRESHLO is a percentage of the difference between the PDAC and NDAC voltages, or, in other words, a percentage of the peak-to-peak magnetic field signal 18. In one embodiment, an upper threshold level 440 (corresponding to the first threshold signal level 242 of FIG. 2) is at approximately 75% of the peak-to-peak signal and a lower threshold 444 (corresponding to the second threshold signal level 244 of FIG. 2) is at approximately 25% of the peak-to-peak signal. It will be appreciated by those of ordinary skill in the art that other percentages may be suitable. Switches 424a and 424b are arranged and controlled so as to apply one of the threshold levels to comparator 428, as shown. In particular, switch 424a is controlled by an inverted version of the comparator output, or POSCOMPN. Switch 424b is controlled by the POSCOMP signal. Further, magnetic field signal 18 is applied to a non-inverting input of comparator 428.

Figure 6A:
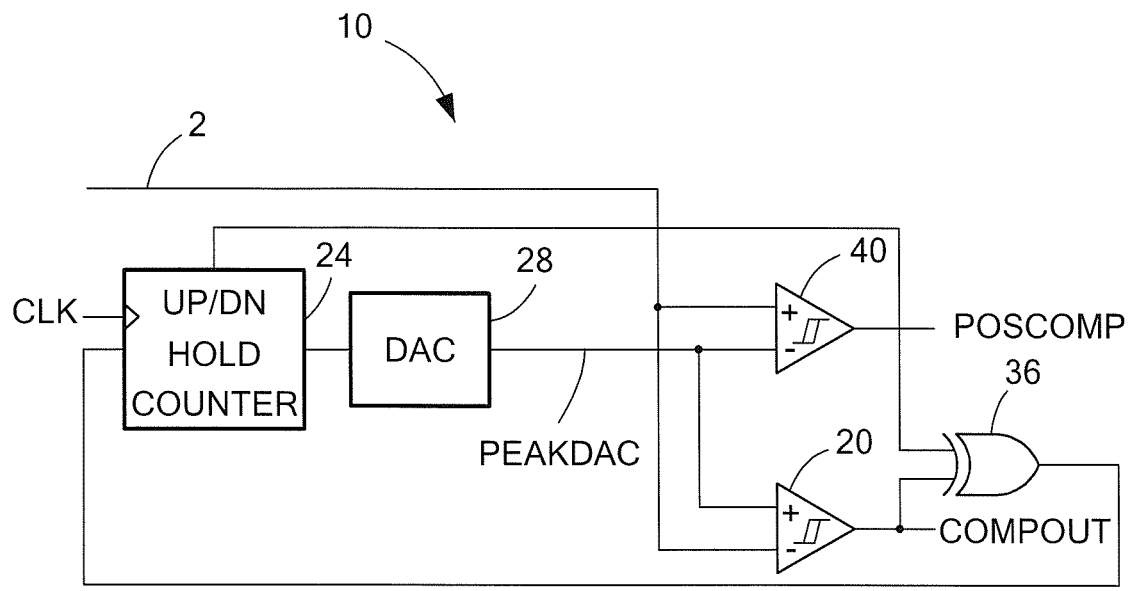
FIG. 6A is a block diagram of an illustrative peak-referenced detector for use in the sensor of FIG. 1A.

Referring now to FIG. 6A, a peak-referenced detector 10 suitable for use as the peak detector 108 of FIG. 1A is shown which uses a single digital-to-analog converter (DAC) 28 to track a magnetic field signal 2. The magnetic field signal 2 is coupled to a non-inverting input of a tracking comparator 20 which receives at the inverting input, the output signal PEAKDAC (i.e., the tracking signal) of a DAC 28, as shown. The magnetic field signal 2 is further coupled to a non-inverting input of a comparator 40, like comparator 112 of FIG. 1A, which receives at the inverting input, the PEAKDAC signal and which generates a detector output signal, POSCOMP. The comparator 40 has internal hysteresis, here on the order of 100 mV, so that the POSCOMP output signal changes state when the magnetic field signal 2 exceeds the PEAKDAC signal by approximately 100 mV. The output signal of the comparator 20, COMPOUT, is coupled to an exclusive OR (XOR) gate 36 which additionally receives the POSCOMP signal and which provides a HOLD input signal to an up/down counter 24. Counter 24 is further responsive to a clock signal, CLK, and to the POSCOMP signal for controlling whether counter 24 counts up or down. The output of the counter 24 is converted into the tracking PEAKDAC signal by the DAC 28.

Figure 6B:
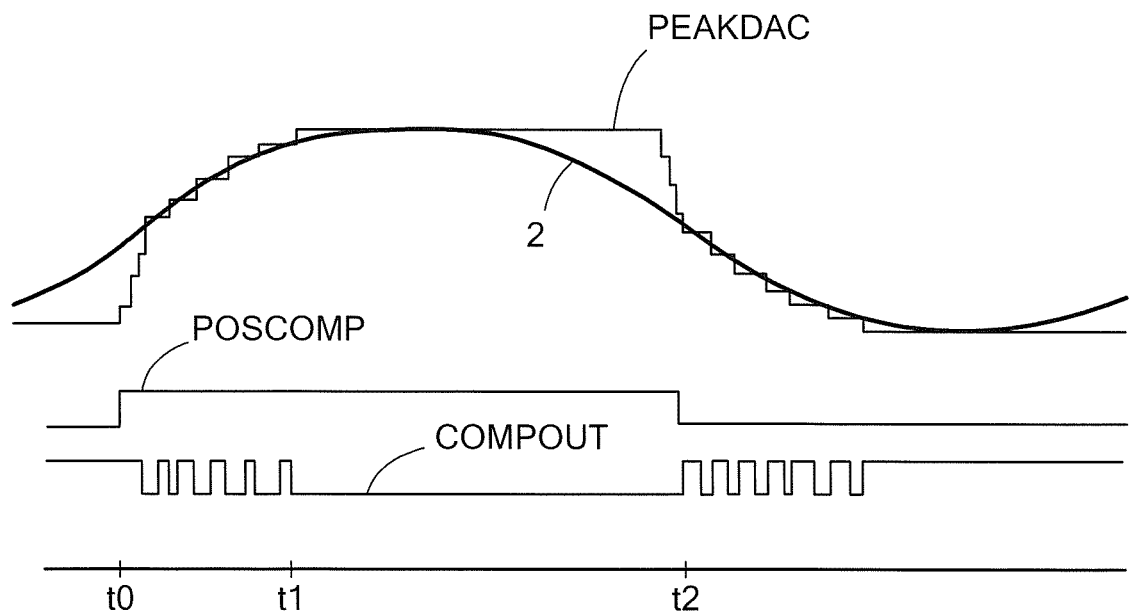
FIG. 6B shows illustrative waveforms associated with the peak-referenced detector of FIG. 6A.

As illustrated in FIG. 6B, whenever the magnetic field signal exceeds the PEAKDAC signal by the small hysteresis level of comparator 20, the COMPOUT signal transitions to a logic high level. The HOLD input to the counter 24 is coupled to exclusive OR (XOR) gate 36, which is coupled to COMPOUT and additionally receives the POSCOMP signal. Once the counter 24 counts up one step, the COMPOUT signal goes low causing the count value to be held until the signal exceeds the PEAKDAC signal by the small hysteresis level of comparator 20 again. When the signal reaches a positive peak, as occurs at time $t_1$, the PEAKDAC signal stays above the signal, thereby causing the HOLD input to the counter 24 to be asserted until the hysteresis of the comparator 40 has been overcome, as occurs when the POSCOMP signal goes low, just before time $t_2$. In this way, the positive and negative peaks of the signal are tracked by the PEAKDAC signal and the detector output signal POSCOMP transitions when the signal differs from the PEAKDAC signal by more than the hysteresis amount of comparator 40 (as occurs at times $t_0$ and $t_2$).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A sensor responsive to the movement of a detection target, comprising:
   a back-bias magnet;
   a magnetic field transducer operative to provide a magnetic field signal proportional to a magnetic field associated with the detection target and the back-bias magnet;
   a peak detector for tracking positive and negative peaks of the magnetic field signal to generate a tracking signal; and
   a comparator having a first input responsive to the magnetic field signal, a second input responsive to an input signal related to the tracking signal, and an output at which is provided an output signal comprising first pulses having a first pulse width when the detection target moves in a first direction and second pulses having a second pulse width when the detection target moves in a second direction, wherein the detection target is positioned in a target plane and the sensor is mountable in a mounting plane and wherein the mounting plane is substantially parallel to the target plane, and wherein the detection target affects the magnetic field only due to the passing of the detection target in the vicinity of the transducer.

2. The sensor of claim 1, wherein the detection target is rotatable about an axis of rotation, wherein a center of the transducer is positioned along a mounting axis and the sensor is at a mounting angle relative to the mounting axis and wherein the sensor is insensitive to the mounting angle.

3. The sensor of claim 1, wherein the detection target is rotatable about an axis of rotation and the first direction of movement is characterized by a clockwise rotation about the axis of rotation and the second direction of movement is characterized by a counter-clockwise rotation about the axis of rotation.

4. The sensor of claim 1, wherein the magnetic field transducer comprises only a single magnetic field sensing element.

5. The sensor of claim 1, wherein the transducer is a magnetic-field-to-voltage transducer.

6. The sensor of claim 1, wherein the transducer is a magnetic-field-to-current transducer.

7. The sensor of claim 1, wherein the transducer is a Hall effect element.

8. The sensor of claim 1, wherein the transducer is a magnetoresistance element.

9. The sensor of claim 1, wherein at least a portion of the magnetic field signal comprises a sawtooth waveform characterized by a plurality of cycles, each cycle having a first portion having a first slope and a second portion having a second slope different than the first slope.

10. The sensor of claim 9, wherein the first portion of each cycle represents a response of the magnetic field transducer to a first profile of the detection target, at least a portion of the first profile defined by a first sloped edge, and the second portion of each cycle represents a magnetic field response of the magnetic field transducer to a second profile of the detection target, at least a portion of the second profile defined by a second sloped edge, wherein the first sloped edge has a smaller slope than the second sloped edge.

11. The sensor of claim 10, wherein the detection target is rotatable about an axis of rotation, wherein a center of the transducer is positioned along a mounting axis and the sensor is at a mounting angle relative to the mounting axis and wherein the sensor is insensitive to the mounting angle.

12. The sensor of claim 1, wherein the input signal to the second comparator input is a threshold voltage at a first level that is a first percentage of the peak-to-peak voltage of the magnetic field signal or at a second level that is a second percentage of the peak-to-peak voltage of the magnetic field signal.

13. The sensor of claim 12, wherein the first percentage is approximately equal to 25% of the peak-to-peak voltage of the magnetic field signal and the second percentage is approximately equal to 75% of the peak-to-peak voltage of the magnetic field signal.

14. The sensor of claim 1, wherein the input signal to the second comparator input is the tracking signal and wherein the comparator has hysteresis of a predetermined offset amount so that the output signal becomes a first binary level when the magnetic field signal exceeds the tracking signal by the predetermined offset amount and becomes a second binary level when the magnetic field signal falls below the tracking signal by the predetermined offset amount.

15. A sensor responsive to the movement of a detection target, comprising:
  a magnetic field transducer operative to provide a magnetic field signal proportional to a magnetic field associated with the detection target;
  a peak detector for tracking positive and negative peaks of the magnetic field signal to generate a tracking signal; and
  a comparator having a first input responsive to the magnetic field signal, a second input responsive to an input signal related to the tracking signal, and an output at which is provided an output signal comprising first pulses having a first pulse width when the detection target moves in a first direction and second pulses having a second pulse width when the detection target moves in a second direction,
  wherein the detection target is positioned in a target plane and is rotatable about an axis of rotation and the sensor is mountable in a mounting plane, wherein the mounting plane is substantially parallel to the target plane, and wherein the detection target affects the magnetic field only due to the passing of features of the detection target in the vicinity of the transducer.

* * * * *

UNITED STATES PATENT AND TRADEMARK OFFICE
CERTIFICATE OF CORRECTION

| | | |
|---|---|---|
| PATENT NO. | : 8,022,692 B2 | Page 1 of 1 |
| APPLICATION NO. | : 12/355882 | |
| DATED | : September 20, 2011 | |
| INVENTOR(S) | : Fernandez et al. | |

It is certified that error appears in the above-identified patent and that said Letters Patent is hereby corrected as shown below:

Col. 9 line 7, delete "having by a" and replace with -- having a --.

Col. 9 line 45, delete "in second," and replace with -- in a second, --.

Col. 10 line 35, delete "when HOLD" and replace with -- when the HOLD --.

Signed and Sealed this
Twenty-second Day of November, 2011

David J. Kappos
*Director of the United States Patent and Trademark Office*